US 6,693,004 B1

(12) United States Patent
Halliyal et al.

(10) Patent No.: US 6,693,004 B1
(45) Date of Patent: Feb. 17, 2004

(54) INTERFACIAL BARRIER LAYER IN SEMICONDUCTOR DEVICES WITH HIGH-K GATE DIELECTRIC MATERIAL

(75) Inventors: Arvind Halliyal, Cupertino, CA (US);
Joong S. Jeon, Cupertino, CA (US);
Minh Van Ngo, Fremont, CA (US);
William G. En, Milpitas, CA (US);
Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/085,318

(22) Filed: Feb. 27, 2002

(51) Int. Cl.[7] .................... H01L 21/8242; H01L 21/20
(52) U.S. Cl. .................... 438/240; 438/386; 438/396; 438/3
(58) Field of Search ................ 438/3, 287, 262, 438/393, 240, 785, 238, 239, 351, 386, 244, 396; 257/321, 310, 410

(56) References Cited

U.S. PATENT DOCUMENTS

| | | | |
|---|---|---|---|
| 5,470,668 A | * 11/1995 | Wu et al. ................ 428/688 |
| 6,013,553 A | 1/2000 | Wallace et al. ............ 438/287 |
| 6,163,049 A | 12/2000 | Bui ........................ 257/321 |
| 6,172,387 B1 | * 1/2001 | Thakur et al. ............ 257/296 |
| 6,210,999 B1 | 4/2001 | Gardner et al. .......... 438/183 |
| 6,242,306 B1 | 6/2001 | Pham et al. .............. 438/262 |
| 6,291,866 B1 | 9/2001 | Wallace et al. .......... 257/410 |
| 6,291,867 B1 | 9/2001 | Wallace et al. .......... 257/410 |
| 6,323,132 B1 | * 11/2001 | Hwang et al. ............ 438/706 |
| 6,369,421 B1 | * 4/2002 | Xiang et al. ............ 257/321 |
| 6,383,989 B2 | * 5/2002 | Jia et al. ................ 505/236 |
| 6,417,537 B1 | 7/2002 | Yang et al. .............. 257/310 |
| 6,476,433 B1 | * 11/2002 | Wu et al. ................ 257/298 |
| 6,492,242 B1 | * 12/2002 | See et al. ................ 438/393 |
| 6,528,858 B1 | * 3/2003 | Yu et al. .................. 257/493 |
| 6,541,280 B2 | * 4/2003 | Kaushik et al. ............ 438/3 |
| 6,541,331 B2 | * 4/2003 | Chudzik et al. .......... 438/240 |
| 6,555,879 B1 | * 4/2003 | Krivokapic et al. ...... 257/382 |
| 6,602,588 B1 | * 8/2003 | Kwon et al. ............ 428/216 |
| 2002/0106536 A1 | 8/2002 | Lee et al. ................ 428/702 |
| 2002/0115252 A1 | 8/2002 | Haukka et al. .......... 438/240 |
| 2002/0142624 A1 | 10/2002 | Levy et al. .............. 438/786 |

* cited by examiner

Primary Examiner—Michael S. Labentritt
(74) Attorney, Agent, or Firm—Renner, Otto, Boisselle & Sklar, LLP

(57) ABSTRACT

A semiconductor device and a process for fabricating the device, including, in one embodiment, a silicon substrate; a first interfacial barrier layer on the silicon substrate, in which the first interfacial barrier layer may include aluminum oxide, silicon nitride, silicon oxynitride or a mixture thereof; and a layer of a high-K dielectric material. The device may further include a second interfacial barrier layer on the high-K dielectric material layer, and may further include a polysilicon or polysilicon-germanium gate electrode formed on the second interfacial barrier layer.

21 Claims, 3 Drawing Sheets

INTERFACIAL BARRIER LAYER IN SEMICONDUCTOR DEVICES WITH HIGH-K GATE DIELECTRIC MATERIAL

TECHNICAL FIELD

The invention relates generally to the fabrication of semiconductor devices and, more particularly, to the fabrication of an interfacial barrier layer in devices with a high-K gate dielectric material layer.

BACKGROUND ART

Fabrication of a semiconductor device and an integrated circuit including the same begins with a semiconductor substrate and employs film formation, ion implantation, photolithographic, etching and deposition techniques to form various structural features in or on the semiconductor substrate to attain individual circuit components which are then interconnected to form ultimately an integrated circuit. Escalating requirements for high densification and performance associated with ultra large-scale integration (ULSI) circuits requires smaller design features, increased transistor and circuit speeds, high reliability and increased manufacturing throughput for competitiveness. As the devices and features shrink, and as the drive for higher performing devices escalates, new problems are discovered that require new methods of fabrication or new arrangements or both.

There is a demand for large-scale and ultra large-scale integrated circuits employing high performance metal-oxide-semiconductor (MOS) devices. MOS devices typically comprise a pair of ion implanted source/drain regions in a semiconductor substrate and a channel region separating the source/drain regions. Above the channel region is typically a thin gate dielectric material, usually referred to as a gate oxide, and a conductive gate comprising conductive polysilicon or another conductive material. In a typical integrated circuit, a plurality of MOS devices of different conductivity types, such as n-type and p-type, and complementary MOS (CMOS) devices employing both p-type and n-type devices are formed on a common substrate. MOS technology offers advantages of significantly reduced power density and dissipation as well as reliability, circuit performance and cost advantages.

The drive towards increased miniaturization and the resultant limits of conventional gate oxide layers have served as an impetus for the development of newer, high dielectric constant ("high-K") materials as substitutes for conventional silicon dioxide-based gate oxide layers. Since the drain current in a MOS device is inversely proportional to the gate oxide thickness, the gate oxide is typically made as thin as possible commensurate with the material's breakdown field and reliability.

Decreasing the thickness of the gate oxide layer between the gate electrode and the source/drain extension regions together with the relatively high electric field across the gate oxide layer, can undesirably cause charge carriers to tunnel across the gate oxide layer. This renders the transistor "leaky", degrading its performance. To alleviate this problem, high-k dielectric materials are used as the gate insulator. Herein, a high-K gate oxide may be referred to as a high-K gate dielectric material layer, in order to emphasize that the gate dielectric comprises a high-K dielectric material rather than silicon dioxide.

One problem which has been encountered in integrating high-K dielectric materials into CMOS devices, and other semiconductor devices such as EEPROMs and other flash memory devices, is the undesirable interaction between many high-K dielectric materials and the silicon used in other semiconductor device structures. Of particular concern is the interaction between the polysilicon typically used for the gate electrode and the high-K material used for the high-K gate dielectric material. Such undesirable interactions are not confined to CMOS devices, but may also occur between polysilicon gate structures and high-K dielectric insulation layers in SONOS-type devices such as the MIR-RORBIT™ flash memory cell available from Advanced Micro Devices, Inc., Sunnyvale, Calif., and in floating gate flash memory cells.

One of the undesirable interactions which may occur is the oxidation of the silicon or polysilicon material in contact with a high-K gate dielectric material layer by oxidizing species used in forming the high-k dielectric material layer, and by the oxygen in the metal oxides of which most high-K dielectric materials are formed. These interactions either lead to an undesirably thick oxide interface at the silicon-high-K interface, or lead to degradation of the high-K by interaction of the polysilicon gate electrode with the high-K gate dielectric during deposition of the polysilicon.

Hence, it would be highly advantageous to develop a process that would permit the use of optimum materials in the formation of a high-K gate dielectric material, without the problems which result from oxidation of silicon, polysilicon or polysilicon-germanium upon which the high-K dielectric material is deposited or which is deposited on the high-K dielectric material. Accordingly, there exists a need for a process of manufacturing MOS semiconductor devices with a high-K dielectric material layer that improves device performance, while avoiding undesirable interactions between elements such as oxidation of silicon substrates or the degradation of high-K gate dielectric materials during deposition of the polysilicon or polysilicon-germanium gate electrode. In particular, a need remains for a process of forming a high-K dielectric material over a silicon substrate, and for forming a polysilicon gate on a high-K gate dielectric material, while avoiding or minimizing oxidation or interaction of high-K dielectric material with the silicon substrate or the polysilicon or polysilicon-germanium gate electrode.

DISCLOSURE OF INVENTION

In one embodiment, the present invention relates to a process for fabricating a semiconductor device having a high-K dielectric layer over a silicon substrate, including steps of depositing on the silicon substrate a first interfacial barrier layer of aluminum oxide, silicon nitride, silicon oxynitride or mixtures thereof; and depositing on the interfacial barrier layer a layer comprising at least one high-K dielectric material, with the proviso that when the first interfacial barrier layer is silicon nitride, silicon oxynitride or mixtures thereof, the layer comprising at least one high-K dielectric material does not include a metal oxynitride.

In another embodiment, the present invention relates to a process for fabricating a semiconductor device having a high-K dielectric layer over a silicon substrate, comprising depositing on the silicon substrate a first interfacial barrier layer of aluminum oxide; and depositing on the first interfacial barrier layer a layer comprising at least one high-K dielectric material.

In still another embodiment, the present invention relates to a process for fabricating a semiconductor device having a high-K dielectric layer over a silicon substrate, comprising depositing on the silicon substrate a first interfacial barrier layer of silicon nitride, silicon oxynitride or mixtures thereof, depositing on the interfacial barrier layer a layer comprising at least one high-K dielectric material, with the proviso that the layer comprising at least one high-K dielectric material does not include a metal oxynitride.

In one embodiment, following deposition of the layer comprising at least one high-K dielectric material layer, a second interfacial barrier layer is deposited on the layer comprising at least one high-K dielectric material.

Following deposition of the foregoing layers, a polysilicon or polysilicon-germanium gate electrode layer may be deposited thereon. The polysilicon or polysilicon-germanium gate electrode may be deposited on the second interfacial barrier layer deposited on the layer comprising at least one high-K dielectric material.

In another embodiment, the present invention relates to a semiconductor device, comprising a silicon substrate; a first interfacial barrier layer on the silicon substrate, the first interfacial barrier layer comprising aluminum oxide, silicon nitride, silicon oxynitride or a mixture thereof and having a thickness in the range from about 1 angstrom to about 5 angstroms; and a layer of a high-K dielectric material having a thickness in the range from about 10 angstroms to about 200 angstroms, with the proviso that when the first interfacial barrier layer is silicon nitride, silicon oxynitride or a mixture thereof, the high-K dielectric material is not a metal oxynitride.

Thus, the present invention provides a solution to the problem of forming a high-K dielectric material layer on a silicon substrate or of forming a polysilicon gate electrode on a high-K dielectric material layer without oxidation of the silicon or polysilicon.

Figure 1:
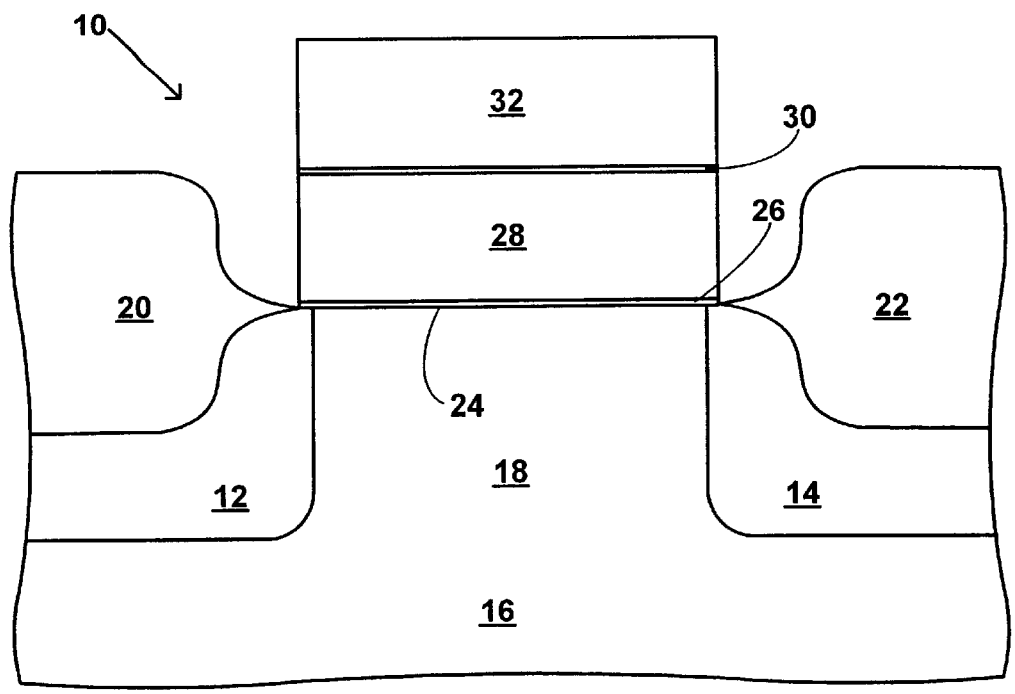
FIG. 1 is a schematic cross-sectional view of an exemplary CMOS structure in accordance with the present invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

MODES FOR CARRYING OUT THE INVENTION

As used herein, the term "standard-K dielectric material" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, silicon nitride, which has a K of about 6–9, and aluminum oxide, which has a K of about 10.

As used herein, the term "high-K dielectric material" refers to a dielectric material having a K greater than about 10. Such high-K dielectric materials include, for example, $HfO_2$, $ZrO_2$ and others known in the art, some of which are specifically identified more fully below. In general, the term "high-K dielectric material" encompasses binary, ternary and higher dielectric oxides and any ferroelectric material having a K of about 10 or more. High-K dielectric materials may also include, for example, composite dielectric materials such as hafnium silicate, which has a K of about 14, a and hafnium silicon nitride, which has a K of about 18.

As used herein, the term "composite dielectric material" refers to a dielectric material comprising the elements of at least two other dielectric materials. A composite dielectric material generally has a K value as defined above for a high-K dielectric material. As described in more detail below, a composite dielectric material may be formed by co-deposition of its component elements, or by sequential deposition followed by a treatment step, e.g., thermal treatment, to combine the elements to form the composite dielectric material.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by codeposition, for example.

Using a high-K dielectric material for, e.g., a gate dielectric layer provides a low electrical thickness to be achieved while retaining a physically thick layer. For example, a high-K dielectric material layer with a K of 40 and a thickness of 100 angstroms (Å) is substantially electrically equivalent to a silicon dioxide layer (K about 4) having a thickness of about 10 Å. The electrically equivalent thickness of a high-K dielectric material layer may be referred to in terms of the equivalent oxide thickness of a layer of silicon dioxide. Thus, a high-K dielectric material layer having a K of 40 and a given physical thickness has an equivalent oxide thickness which is approximately 1/10 the given physical thickness. For high-K dielectric materials, reliably thick dielectric material layers can be formed while maintaining equivalent oxide thickness values lower than are possible with unreliably thin silicon dioxide layers. In this way, the reliability problems associated with very thin dielectric layers may be avoided while transistor performance is increased.

Approximate K-values or, in some cases, a range of K-values, are shown below in Table 1 for several exemplary dielectric materials. It is understood that the present invention is not limited to the specific dielectric materials disclosed herein, but may include any appropriate standard-K, high-K and composite dielectric materials which are known and are compatible with the remaining elements of the semiconductor device with which the dielectric materials are to be used.

TABLE 1

| Dielectric Material | Approximate Dielectric Constant (K) (Relative Permittivity) |
| --- | --- |
| silicon dioxide | 4 |
| silicon nitride | 6–9 |
| silicon oxynitride | 4–8 |
| aluminum oxide | 10 |
| zirconium silicate | 12 |

TABLE 1-continued

| Dielectric Material | Approximate Dielectric Constant (K) (Relative Permittivity) |
|---|---|
| hafnium silicate | 15 |
| hafnium aluminate | 12–20 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—~200 |
| $PbTiO_3$ | ~20—~200 |
| $BaTiO_3$ | ~20—~200 |
| $SrTiO_3$ | ~20—~200 |
| $PbZrO_3$ | ~20—~200 |
| PST ($PbSc_xTa_{1-x}O_3$) | ~20—~3000 |
| PZN ($PbZn_xNb_{1-x}O_3$) | ~200—~5000 |
| PZT ($PbZr_xTi_{1-x}O_3$) | ~100—~1000 |
| PMN ($PbMg_xNb_{1-x}O_3$) | ~200—~5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$, in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a high-K dielectric material may be used adjacent to the silicon surface of a semiconductor substrate or adjacent to a silicon or polysilicon surface. For example, a polysilicon gate electrode in a FET, in a polysilicon floating gate electrode EEPROM flash memory device, in a two-bit flash memory device, such as the MIRROR-BIT™ flash memory device available from Advanced Micro Devices, Sunnyvale, Calif. In general, the invention is applicable to any device having a high-K dielectric material layer which is to be formed in contact with silicon or polysilicon in which it is desired to avoid oxidation of the silicon or polysilicon by the high-K dielectric material or by processes for its deposition. For devices in which high-K dielectric material are used, the present invention will help to minimize or avoid the growth of interfacial silicon dioxide and reduce the interaction of the high-K dielectric material with the polysilicon or polysilicon-germanium gate electrode. Thus, it is to be understood that the present invention is not limited to the specific illustrative embodiments described below.

In one embodiment, the present invention relates to a process of making the semiconductor device, in which the semiconductor device includes a semiconductor substrate, a polysilicon gate electrode and a high-K gate dielectric material layer separating the polysilicon gate electrode from the semiconductor device surface, in which an interfacial barrier layer is deposited on the silicon substrate, and in one embodiment, a second interfacial barrier layer is deposited on the high-K dielectric material layer between it and the overlying poly gate electrode. The interfacial barrier layer may include one or more of, for example, aluminum oxide, silicon oxynitride or silicon nitride. In one embodiment, when the interfacial barrier layer is silicon oxynitride, silicon nitride or a mixture thereof, the high-K dielectric material layer is not a metal oxynitride.

Referring first to FIG. 1, there is schematically shown in cross-section a transistor 10 such as that used in a CMOS device. The transistor 10 includes source/drain regions 12 and 14 located in a semiconductor substrate 16 and separated by a channel region 18. First and second bit line oxide regions 20 and 22 overlie source/drain regions 12 and 14, respectively. In contact with an upper surface 24 of the silicon substrate 16 is a first interfacial barrier layer 26. A layer 28 of a high-K dielectric material overlies the first interfacial barrier layer 26. A second interfacial barrier layer 30 overlies the layer 28 of a high-K dielectric material. Finally a gate electrode 32 overlies the second interfacial barrier layer 30. Thus, the first interfacial barrier layer 26 and the second interfacial barrier layer 30 separate the layer 28 of a high-K dielectric material from the silicon substrate 16 and from the gate electrode 32, which may be formed of, for example, polysilicon or polysilicon-germanium, respectively. The second interfacial barrier layer 30 may not be needed if the gate electrode 32 is formed of a material which is not susceptible to oxidation by the high-K dielectric material layer 28, or which does not interact with the high-K dielectric material.

Not shown in FIG. 1 are additional parts of a working semiconductor device, such as electrical conductors, interlayer dielectric layer, contacts and other parts of the structure which would be included in a complete, working semiconductor device. These additional parts are not germane to the present invention, and for simplicity and brevity are neither shown nor described, but could be easily added as will be understood by those of skill in the art.

In one embodiment, the semiconductor substrate is a bulk silicon substrate. In one embodiment, the semiconductor substrate is a silicon-on-insulator semiconductor substrate. In another embodiment, the semiconductor substrate is a p-doped or an n-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate, except that it is primarily directed to a semiconductor substrate or layer having a silicon, polysilicon or polysilicon-germanium surface. In general, for purposes of the present invention, reference to a silicon surface is intended to refer to both a silicon surface (monocrystalline or amorphous) and a polysilicon surface, unless otherwise specifically stated.

The present invention further relates to a process of making the above-described semiconductor device.

Additional details of the process of the present invention are set forth below. The specific examples provided herein are intended to explain the invention, but are not intended to limit the scope of the invention, which is defined by the attached claims.

Figure 2:
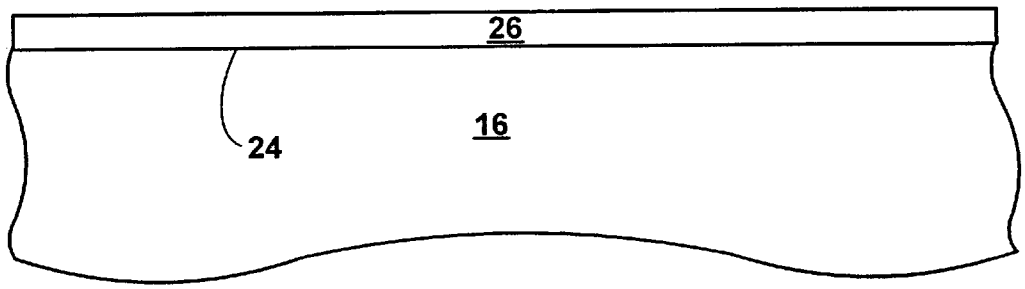
FIGS. 2–5 are schematic cross-sectional views of steps of fabricating a semiconductor substrate comprising an interfacial dielectric material layer and a high-K dielectric material layer in accordance with an embodiment of the present invention.
Figure 6:
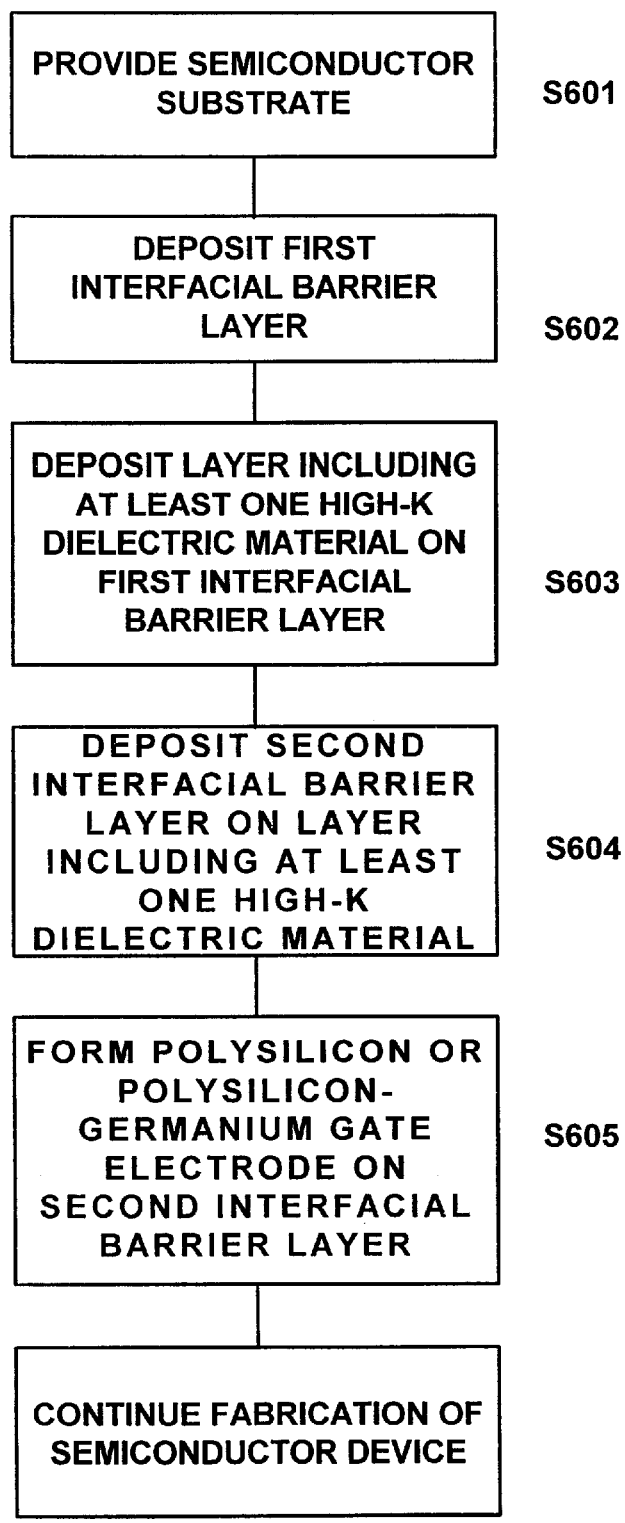
FIG. 6 is a schematic flow diagram showing the basic steps in a process of fabricating a semiconductor device in accordance with the present invention.

In the first step of the process of the present invention, shown in FIG. 6 as Step S601, a semiconductor substrate 16 is provided, as shown in, e.g., FIG. 2. The semiconductor substrate may be any appropriately selected semiconductor substrate known in the art, as described above. In some embodiments, the semiconductor substrate 16 may be n- or p-doped. The semiconductor substrate 16 includes a surface 24, shown in FIGS. 1 and 2. In one embodiment, the surface 24 is silicon, and in another embodiment, the surface 24 is polysilicon.

In the second step of the process of the present invention, shown in FIG. 6 as Step S602, a first interfacial barrier layer 26 is deposited on the surface 24. FIG. 2 shows an embodiment of the semiconductor substrate 16 after deposition of an interfacial barrier layer 26 on the surface 24.

In one embodiment, prior to depositing the first interfacial barrier layer 26, the surface 24 is cleaned to remove any contaminants and to remove any native oxides or any other passivating material (such as hydrogen) which may have been formed thereon. Suitable methods for such cleaning and removal are known in the art.

In one embodiment, the first interfacial barrier layer 26 comprises aluminum oxide ($Al_2O_3$), silicon nitride ($Si_3N_4$), silicon oxynitride ($Si_wO_xN_y$, and which may also include $Si_wO_xN_yH_z$, in which w, x, y and z vary depending on formation conditions), or mixtures thereof. Silicon oxynitride also may be referred to simply as SiON. Mixtures of these materials including physical mixtures or chemical composites are within the scope of the present invention. A physical mixture may be obtained, for example, by sequential deposition of the components of the mixture. A chemical composite may be obtained, for example, by codeposition (i.e., simultaneous deposition) of the elements of the composite material. For example, in one embodiment, the interfacial barrier layer 26 is a composite or mixture of aluminum oxide and silicon nitride. In another embodiment, the interfacial barrier layer 26 is a composite or mixture of aluminum oxide and silicon oxynitride. While it may be possible to form a composite or mixture of silicon nitride and silicon oxynitride, due to the variable stoichiometry of silicon oxynitride, such a mixture may be indistinguishable from an embodiment of silicon oxynitride having a high content of nitrogen.

In one embodiment, the first interfacial barrier layer 26 may be deposited by ALCVD, RTCVD, MOCVD or LPCVD. In other embodiments the interfacial barrier layer 26 may be deposited by any method capable of depositing a uniform layer as thin as a monolayer of the material of the interfacial barrier layer 26. While other CVD or physical deposition processes may possibly be used, these other methods are not generally capable of depositing a reliably uniform monolayer, and so are not preferred.

The interfacial barrier layer 26 is deposited, in one embodiment, to a thickness in the range from about 1 angstrom (Å) to about 20 Å. In another embodiment, the thickness of the interfacial barrier layer 26 is in the range from about 1 Å to about 5 Å. In another embodiment, the interfacial barrier layer 26 is deposited in a monolayer, in which the thickness of the layer is determined by the thickness of a monolayer of the molecules of the material from which the interfacial barrier layer 26 is formed. For example, the thickness of a monolayer of aluminum oxide is about 1–2 Å. In other embodiments, the thickness of the interfacial barrier layer 26 ranges from one monolayer to several monolayers of the material. Several monolayers means an integral or non-integral multiple (i.e., about 1× to about 5×) of the thickness of a single monolayer.

While thicker interfacial barrier layers are possible, as the thickness of the interfacial barrier layer increases, the overall K value of the interpoly dielectric or gate dielectric is reduced from the K value of the high-K dielectric material layer which will form the bulk of the interpoly or gate dielectric which is to be formed subsequently. Thus, having an interfacial barrier layer too thick would detract from the benefits of having a high-K dielectric material layer.

The interfacial barrier layer 26 is intended to provide a barrier at the interface between a high-K dielectric material and a silicon or polysilicon layer which would otherwise be in direct contact with the high-K dielectric material. The purpose of the barrier is to avoid undesired reactions between the silicon or polysilicon and the high-K dielectric material which may otherwise occur, as discussed in the background section above. Thus, the thickness of the interfacial barrier layer 26 may be minimized, consistent with its barrier function.

Figure 3:
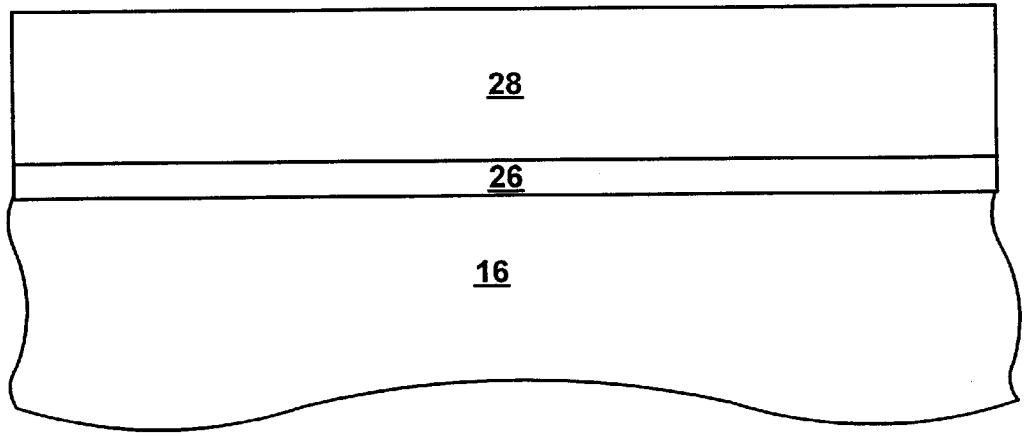

In the third step of the process of the present invention, shown in FIG. 6 as Step S603, a high-K dielectric material layer 28 is deposited on the surface of the interfacial barrier layer 26. FIG. 3 shows an embodiment of the semiconductor substrate 16 after deposition of an interfacial barrier layer 26 on the surface 24 and deposition of a high-K dielectric material layer 28 on the interfacial barrier layer 26.

The high-K dielectric material layer 28 may be deposited on the interfacial barrier layer 26 by any appropriate method known in the art. For example, the high-K dielectric material may be deposited by LPCVD, RTCVD, MOCVD or ALCVD. In addition, the high-K dielectric material may be deposited by PVD or sol-gel deposition techniques.

The high-K dielectric material may comprise any high-K dielectric material which is appropriate for use with the semiconductor device 10 to be fabricated. The high-K dielectric material layer 28 may comprise, for example, any one of a variety of known high-K dielectric materials, such as hafnium oxide, yttrium oxide, lanthanum oxide, and combinations of such high-K dielectric materials with standard-K dielectric materials (e.g., $SiO_2$), such as hafnium silicate, $HfSiO_4$. Suitable exemplary high-K dielectric materials include those disclosed in the above table and associated disclosure.

In one embodiment, the high-K dielectric material includes at least one of $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. In another embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 10 or higher, also may be used in the present invention.

In one embodiment, the high-K material is a high-K material other than tantalum oxide ($Ta_2O_5$). Tantalum oxide has been found, in some embodiments, to exhibit an undesirably high leakage current.

In one embodiment, when the interfacial barrier layer 26 is silicon oxynitride or silicon nitride, or a mixture thereof, the high-K dielectric material is not a metal oxynitride or a metal silicon oxynitride. The term "metal oxynitride" as used herein includes both metal oxynitride and metal silicon oxynitride compounds. Metal oxynitrides have the general formula MON or MSiON. The exact stoichiometry varies with the valence of the metal, whether or not silicon is present, and the conditions of formation of the metal oxynitride.

In one embodiment, the high-K dielectric material has a K value in the range from about 10 to about 5000. In another embodiment, the high-K dielectric material has a K value in the range from about 10 to about 500, and in yet another embodiment, the K value is from about 10 to about 50.

FIG. 3 shows the nascent semiconductor device 10 after deposition of a high-K dielectric material layer 28, i.e., at the completion of step S603. Although only a single high-K dielectric material layer 28 is shown in FIG. 3, it is understood that multiple sub-layers may be included in the high-K dielectric material layer 28, as long as the upper surface of the layer 28 comprises a high-K dielectric material.

Figure 4:
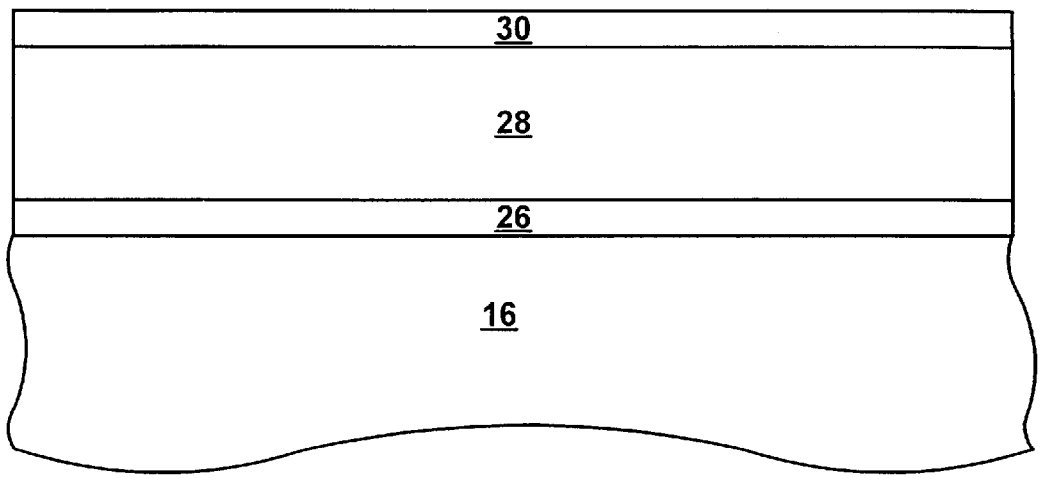

In the fourth step of the process of the present invention, shown in FIG. 6 as Step S604, a second interfacial barrier layer 30 may be deposited on the high-K dielectric material layer 28. The second interfacial barrier layer 30 is optional, since it may not be needed if the gate electrode to be subsequently formed is made of a material which is not susceptible to reaction with the high-K dielectric material which forms the layer 28. For example, if a metal gate electrode is to be used, the second interfacial barrier layer 30 may not be needed. FIG. 4 shows an embodiment of the semiconductor substrate 16 after deposition of an interfacial barrier layer 26 on the surface 24, deposition of the high-K dielectric material layer 28 on the first interfacial barrier layer 26, and deposition of the second interfacial barrier layer 30 on the high-K dielectric material layer 28.

The materials and processes for depositing the second interfacial barrier layer 30, and the range of thicknesses of the layer 30, are the same as those disclosed above for the first interfacial barrier layer 26, and are not repeated herein for the sake of brevity. The material from which the second interfacial barrier layer 30 is formed may be the same as, or may be different from, the material used for the first interfacial barrier layer 26. Thus, for example, the first interfacial barrier layer 26 may be aluminum oxide, and the second interfacial barrier layer 30 may be aluminum oxide, or it may be silicon nitride, or any of the mixtures or composites of these materials.

Figure 5:
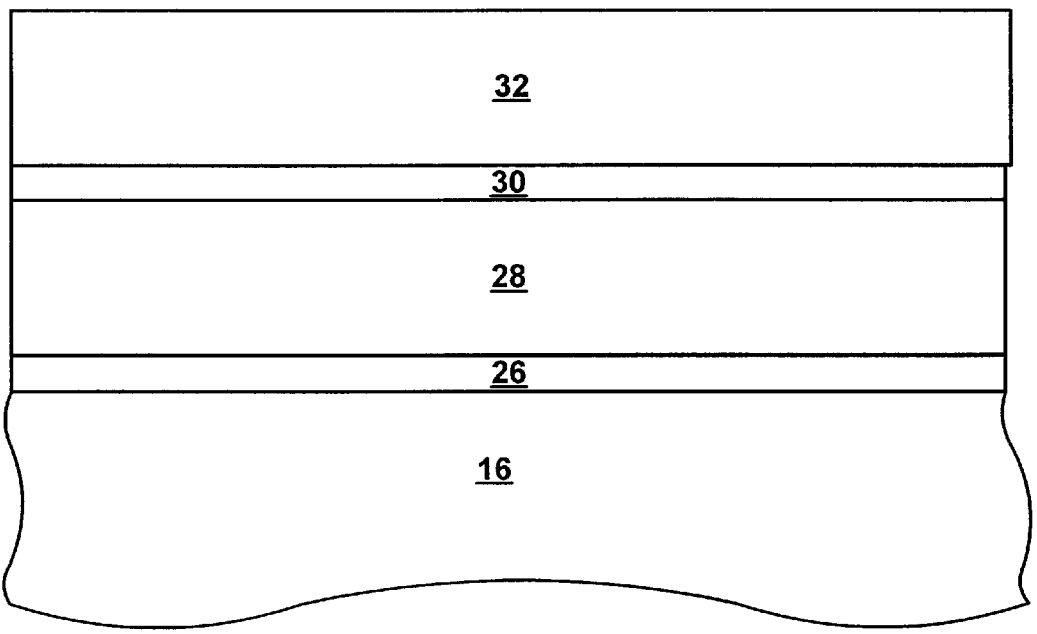

In the fifth step of the process of the present invention, shown in FIG. 6 as Step S605, a polysilicon gate electrode 32 is deposited on the high-K dielectric material layer 28. The polysilicon gate electrode 32 may be, e.g., a gate electrode in, e.g., a FET, or it may be a control gate in a flash memory device. FIG. 5 shows an embodiment of the semiconductor substrate 16 after deposition of a polysilicon or polysilicon-germanium gate electrode 32 on the second interfacial barrier layer 30.

In the embodiment shown in FIG. 5, the polysilicon or polysilicon-germanium gate electrode 32 may be deposited on the surface of the second interfacial barrier layer 30 by any suitable method known in the art. Thus, the interfacial barrier layer 30 forms a barrier between the polysilicon of the gate electrode 32 and the high-K dielectric material layer 28.

In one embodiment the step of depositing the polysilicon layer 32 is carried out by LPCVD, RTCVD, MOCVD or ALCVD. In one embodiment, the step of depositing a polysilicon layer is carried out by a plasma CVD process, i.e., PECVD. In one embodiment, the polysilicon layer 32 is deposited by LPCVD.

Portions of the polysilicon layer 32, the interfacial barrier layers 30 and 26 and the high-K dielectric material layer 28 will subsequently be etched away, to form the structure shown in FIG. 1. Upon completion of formation of the respective layers and etching back, the semiconductor device 10 shown in FIG. 1 is obtained.

The source region 12 and the drain region 14 may be formed prior to or subsequent to deposition of the interfacial barrier layers 26 and 30, the high-K gate dielectric material layer 28 and the polysilicon gate electrode 32, or subsequent thereto, such as by a self-aligned implantation method. Thereafter, the semiconductor device 10 may be further processed as appropriate to the fabrication scheme of which the process of the present invention is a part, as shown in the final step of FIG. 6.

INDUSTRIAL APPLICABILITY

According to the present invention, a polysilicon or polysilicon-germanium gate electrode may be formed on a high-K gate dielectric material layer, and the high-K dielectric material layer may be formed on a semiconductor substrate, without oxidation of the silicon, polysilicon or polysilicon-germanium by the high-K dielectric material or by the process of forming the high-K dielectric material and without degradation of the high-K dielectric material either due to the reaction with silicon substrate or with the polysilicon or polysilicon-germaniumn gate. Thus, a distinct, defect-free interface may be formed between these layers, which avoids leakage currents and other problems which may occur when a polysilicon or polysilicon-germanium layer is formed directly on a high-K dielectric material layer, or when a high-K dielectric material is formed directly on a silicon substrate, by conventional methods. The interfacial barrier layers and provide a barrier at the interface between the possibly-reactive layers, thus avoiding the undesirable effects which could result from the reaction, and avoiding a significant loss of the K-value of the high-K dielectric material which might result from use of a thicker barrier layer, or from use of a barrier layer formed of silicon dioxide.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A process for fabricating a semiconductor device having a high-K dielectric layer over a silicon substrate, comprising:

depositing on the silicon substrate a first interfacial barrier layer of aluminum oxide, silicon nitride, silicon oxynitride or mixtures thereof;

depositing on the interfacial barrier layer a layer comprising at least one high-K dielectric material, with the proviso that when the first interfacial barrier layer is silicon nitride, silicon oxynitride or mixtures thereof, the layer comprising at least one high-K dielectric material does not include a metal oxynitride, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lead titanate ($PbTiO_3$), silicon titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

2. The process of claim 1, wherein the first interfacial barrier layer is deposited by ALCVD, RTCVD or MOCVD.

3. The process of claim 1, wherein the layer of high-K dielectric material is deposited by ALCVD, RTCVD or MOCVD.

4. The process of claim 1, further comprising depositing on the layer of high-K dielectric material a second interfacial barrier layer of a dielectric material.

5. The process of claim 4, wherein the second interfacial barrier layer comprises a dielectric material comprising aluminum oxide, silicon oxynitride, silicon nitride or mixtures thereof.

6. The process of claim 4, further comprising depositing a polysilicon or polysilicon-germanium layer over the second interfacial barrier layer.

7. A process for fabricating a semi conductor device having a high-K dielectric layer over a silicon substrate, comprising:

depositing on the silicon substrate a first interfacial barrier layer of aluminum oxide;

depositing on the first interfacial barrier layer a layer comprising at least one high-K dielectric material, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lead titanate ($PbTiO_3$), silicon titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

8. The process of claim 7, wherein the first interfacial barrier layer is deposited by ALCVD, RTCVD or MOCVD.

9. The process of claim 7, wherein the layer of high-K dielectric material is deposited by ALCVD, RTCVD or MOCVD.

10. The process of claim 7, further comprising depositing on the layer of high-K dielectric material a second interfacial barrier layer of a dielectric material.

11. The process of claim 10, wherein the second interfacial barrier layer comprises a dielectric material comprising aluminum oxide, silicon oxynitride, silicon nitride or mixtures thereof.

12. The process of claim 10, further comprising depositing a polysilicon or polysilicon germanium layer over the second interfacial barrier layer.

13. A process for fabricating a semiconductor device having a high-K dielectric layer over a silicon substrate, comprising:

depositing on the silicon substrate a first interfacial barrier layer of silicon nitride, silicon oxynitride or mixtures thereof;

depositing on the interfacial barrier layer a layer comprising at least one high-K dielectric material, with the proviso that the layer comprising at least one high-K dielectric material does not include a metal oxynitride, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lead titanate ($PbTiO_3$), silicon titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

14. The process of claim 13, wherein the interfacial barrier layer is deposited by ALCVD, RTCVD or MOCVD.

15. The process of claim 13, wherein the layer of high-K dielectric material is deposited by ALCVD, RTCVD or MOCVD.

16. The process of claim 13, further comprising depositing a second interfacial barrier layer on the layer comprising a high-K dielectric material.

17. The process of claim 16, further comprising depositing a polysilicon or polysilicon germanium layer over the second interfacial barrier layer.

18. The process of claim 1, wherein the interfaial barrier layer is deposited to a thickness in the range from about 1 to about 5 monolayers of molecules of material of which the interfacial barrier layer is comprised.

19. The process of claim 4, wherein the second interfacial barrier layer is deposited to a thickness in the range from about 1 to about 5 monolayers of molecules of material of which the second interfacial barrier layer is comprised.

20. The process of claim 7, wherein the interfacial barrier layer is deposited to a thickness in the range from about 1 to about 5 monolayers of aluminum oxide.

21. The process of claim 13, wherein the interfacial barrier layer is deposited to a thickness in the range from about 1 to about 5 monolayers of molecules of material of which die interfacial barrier layer is comprised.

* * * * *

UNITED STATES PATENT AND TRADEMARK OFFICE
CERTIFICATE OF CORRECTION

PATENT NO. : 6,693,004 B1
DATED : February 17, 2004
INVENTOR(S) : Halliyal et al.

It is certified that error appears in the above-identified patent and that said Letters Patent is hereby corrected as shown below:

Column 12,
Line 49, replace "interfaial" with -- interfacial --.
Line 63, replace "die" with -- the --.

Signed and Sealed this

Twenty-second Day of June, 2004

JON W. DUDAS
*Acting Director of the United States Patent and Trademark Office*